United States Patent [19]

Cason et al.

[11] 4,110,683

[45] Aug. 29, 1978

[54] APPARATUS INCLUDING A PLURALITY OF SPACED TRANSFORMERS FOR LOCATING SHORT CIRCUITS IN CABLES

[75] Inventors: Robert L. Cason, Cape Canaveral; John J. McStay, Titusville, both of Fla.

[73] Assignee: The United States of America as represented by the Administrator of the National Aeronautics and Space Administration, Washington, D.C.

[21] Appl. No.: 814,004

[22] Filed: Jul. 8, 1977

[51] Int. Cl.² .................... G01R 31/08; G01R 19/16
[52] U.S. Cl. ........................................ 324/52; 324/127; 324/133; 340/650; 340/664
[58] Field of Search ............ 324/51, 52, 127, 133, 324/102; 340/248 C, 248 E, 253 A, 253 E, 227 R, 409

[56] References Cited

U.S. PATENT DOCUMENTS

| | | | |
|---|---|---|---|
| 3,099,828 | 7/1963 | Kelley | 340/248 E |
| 3,125,720 | 3/1964 | Swift | 324/51 |
| 3,200,392 | 8/1965 | Chumakov | 340/253 E |
| 3,356,939 | 12/1967 | Stevenson | 324/127 X |
| 3,477,019 | 11/1969 | Hartmann | 324/52 X |
| 3,579,280 | 5/1971 | Florance et al. | 324/127 X |
| 3,588,689 | 6/1971 | Crawford | 324/52 |
| 3,771,049 | 11/1973 | Piccione | 324/51 |
| 3,832,678 | 8/1974 | Gysell et al. | 340/227 R |

*Primary Examiner*—Gerard R. Strecker
*Attorney, Agent, or Firm*—James O. Harrell; John R. Manning

[57] ABSTRACT

A cable fault locator for sensing faults such as short circuits in power cables. The apparatus includes a plurality of current transformers strategically located along said cable. Trigger circuits are connected to each of the current transformers for placing a resistor in series with a resistive element responsive to an abnormally high current flowing through that portion of the cable. By measuring the voltage drop across the resistive element, the location of the fault can be determined.

4 Claims, 2 Drawing Figures

APPARATUS INCLUDING A PLURALITY OF SPACED TRANSFORMERS FOR LOCATING SHORT CIRCUITS IN CABLES

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The present invention relates to a cable fault locator and more particularly to an apparatus for locating cable faults in underground or overhead power cables by monitoring the ground fault current at preselected locations and transmitting the data to a remote monitor or computer.

The present mode of locating a fault in power cables requires disconnecting all ends of the cable, putting a signal consisting of high voltage pulses thereon, and then, by traveling parallel to the cable, the signal is traced to the point of the fault. This concept of fault location is rather time-consuming.

Another fault indicator and locator for buried cables is disclosed in U.S. Pat. No. 3,771,049. In this particular patent, an underground cable fault indicator and locator is provided to indicate the location of a fault or short circuit in the cable. The cable is passed through the apertures of a plurality of spaced transformer sensors connected to indicating elements. Upon the occurrence of a fault in the cable, the indicating element provides a visual indication of the section of cable in which the fault has occurred. As illustrated in FIG. 1, lamps are usually provided above the surface for being illuminated responsive to a short occurring in that section of the cable.

Another electrical ground fault detector is disclosed in U.S. Pat. No. 3,579,280. In this particular ground fault detector, a ring-type current transformer is utilized for triggering a silicon controlled rectifier for activating an alarm responsive to current flowing through the supply line to indicate a ground fault.

SUMMARY OF THE INVENTION

The invention relates to an apparatus for monitoring faults such as short circuits in an electrical power cable which produces an abnormally high current in the portion of the cable extending between a power supply connected to one end of the cable and the point where the cable is grounded. The apparatus includes a resistive element which is connected to a power supply. A plurality of current transformers are spaced at predetermined points along the cable. A plurality of resistors corresponding in number to the current transformers are provided. Trigger circuit means are connected to each of the current transformers for selectively connecting one or more of the resistors in series with the resistive element responsive to an abnormally high current flowing through the respective current transformer connected thereto. Voltage sensing means is provided for measuring the voltage drop across the resistive element so as to determine the number of transformers through which the abnormally high current flow travels. Thus, the location of the grounded point within the cable can be determined from the magnitude of the voltage drop across the resistive element.

Each of the trigger circuits includes a silicon controlled rectifier that is connected to a respective transformer so as to place a respective resistor in series with the resistive element responsive to an abnormally high current flowing through that particular transformer.

Accordingly, it is an important object of the present invention to provide a low cost system for locating cable fault in an underground or overhead power cable system by monitoring the ground fault current at preselected locations and transmitting the data to a remote monitor or computer.

Another important object of the present invention is to provide a relatively simple fault detector for power cables which is simple in operation and sensitive to faults in power cables.

Another object of the present invention is to provide a fault indicator and locator which is safe in operation even when the cable that is being monitored has an abnormally high current flow therethrough.

These and other objects and advantages of the invention will become apparent upon reference to the following specification, attendant claims, and drawing.

DESCRIPTION OF THE PREFERRED EMBODIMENT

Figure 1:
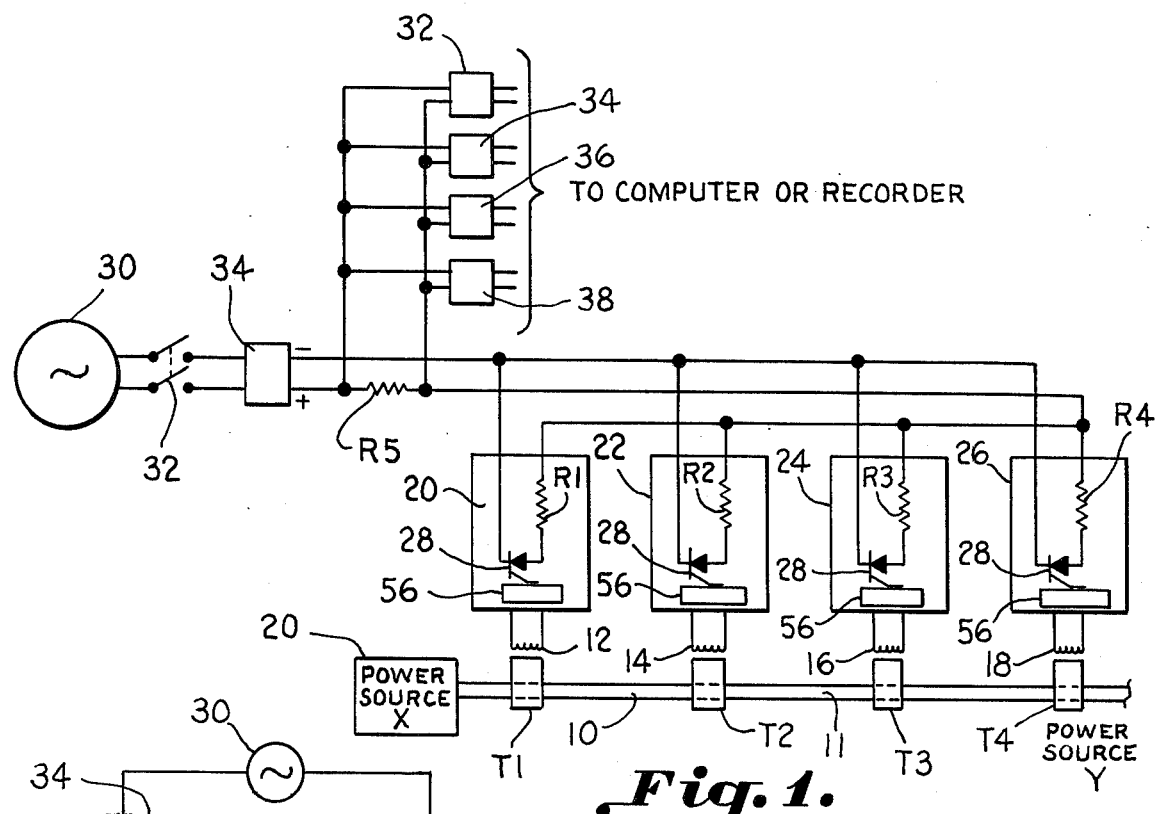
FIG. 1 is a schematic diagram illustrating the cable fault detector constructed in accordance with the present invention.

Referring now in more detail to FIG. 1 of the drawing, there is illustrated a conventional cable 10 which may be of any length. The cable 10 normally has a power supply connected to one end thereof so as to produce a current flow therethrough. If a ground develops along the cable, it will cause a large increase in current from the power supply to that ground point. For purposes of illustration, the ground point will be described as being at point 11. Therefore, if or when point 11 becomes grounded, the current flow through the portion of the cable which includes transformers T1 and T2, increases substantially.

Transformers T1, T2, T3 and T4 are strategically spaced along the cable. When the current flow through the portion of the cable which includes transformers T1 and T2 increases abnormally high as a result of a short circuit, a larger voltage is produced on the secondary windings 12 and 14 of transformers T1 and T2. There is no increase in voltage on secondary windings 16 and 18 since transformers T3 and T4 are not located between the shorted point 11 and the power supply 20 connected to the other end of the cable. Monitoring circuits 20, 22, 24 and 26 are each connected to a respective output winding 12, 14, 16 and 18 of the current transformers. These monitoring circuits include a triggering silicon controlled rectifier 28 which is triggered on responsive to a predetermined voltage being applied thereto for closing a circuit that includes one of the resistors R1, R2, R3, or R4 for placing it in series with a resistive element R5. The resistive element R5 is, in turn, connected to a power supply 30 by means of an on-off switch 32 and a DC rectifier 34. The power supply may be any suitable AC power supply. Connected across the resistive element R5 are voltage measuring devices 32, 34, 36, and 38. These voltage measuring devices 32-38 may be any suitable voltage detectors such as volt meters or electronic circuits that are triggered "on" upon a predetermined voltage being applied thereto. These trigger circuits in one particular embodiment illuminate lamps responsive to a predetermined voltage being applied thereto. For example, the voltage detector circuit 32 will be activated when the voltage drop across resistor R5 is of a value that is produced by placing resistor R1 in series therewith. Voltage detector 34 is, in turn, activated when both resistors R1 and R2 are placed in series with resistive element R5. Similarly, voltage detector circuit 38 is activated wherein all four of the resistors R1 through R4 are placed in series with resistive element R5. The outputs of the voltage detector circuits 32 through 38 can be connected to a computer and/or recorder.

Figure 2:
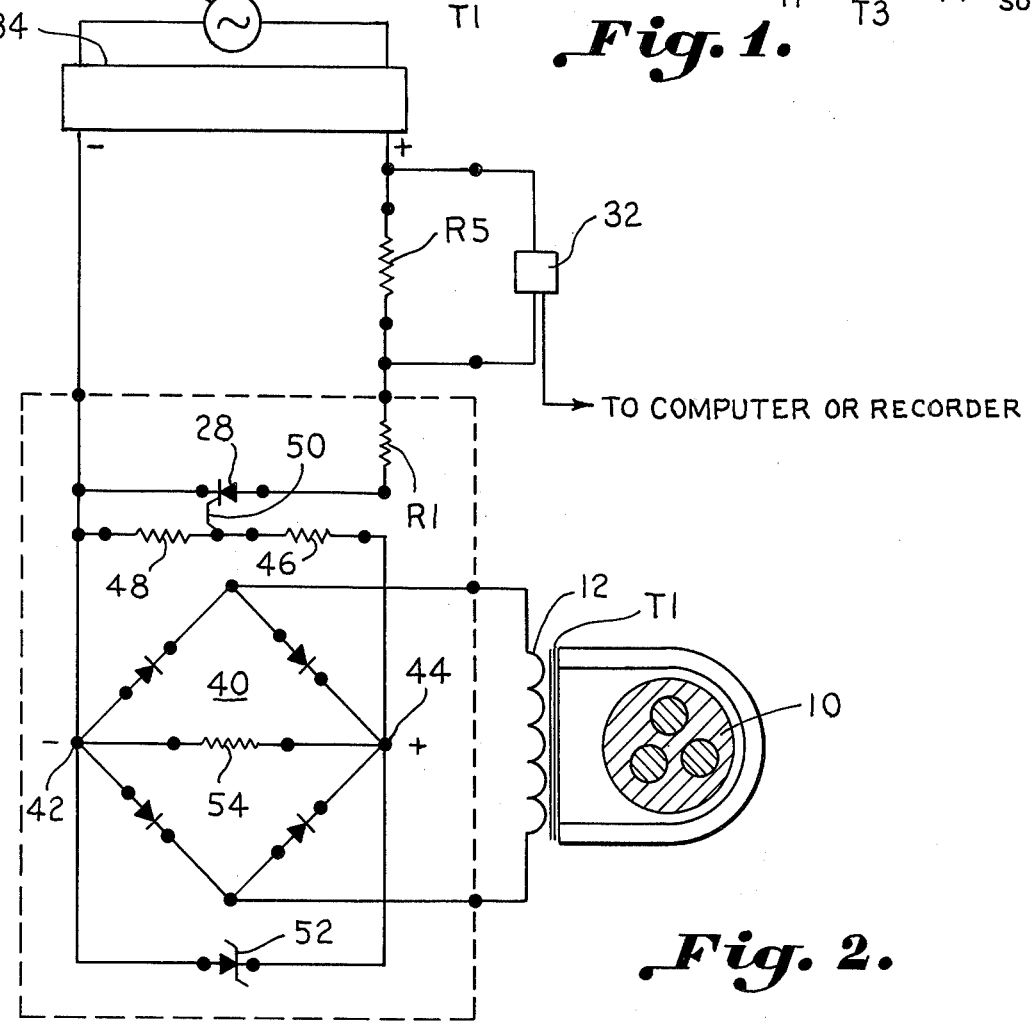
FIG. 2 is a more detailed schematic diagram illustrating a portion of the cable fault detector illustrated in FIG. 1.

Referring in more detail to FIG. 2 of the drawing, a more detailed schematic diagram of the monitoring circuit and, in particular, monitoring circuit 20 is illustrated. Each of the monitoring circuits 22, 24 and 25 correspond thereto. The current transformer includes a U-shaped coil of rectangular cross section with the power cable 10 occupying the semi-circular end of the U. Between the ends of the U is clamped a core of circular cross-section which will carry the secondary winding 12. Both pieces are of low carbon steel.

As the current changes as a result of a ground developing within the cable 10, the current transformer T1 will detect this abnormally high current flow through the cable 10 and produce a voltage on output winding 12. This voltage is coupled to the input of a full-wave rectifier generally designated by the reference character 40. The output of the full-wave rectifier is taken across terminals 42 and 44 and fed to a voltage divider circuit including resistors 46 and 48. An input terminal 50 of silicon controlled rectifier 28 is connected between the resistors 46 and 48 for being activated upon a predetermined voltage being applied thereto.

When the silicon controlled rectifier 28 is triggered "on", current flows from the source of power 30 through resistors R5 and R1. The voltage sensor 32 is connected across resistor R5 for detecting the voltage drop thereacross. The voltage drop across resistor R5 varies according to the number of resistors R1 through R4 that are placed in series therewith.

A zener diode 52 is connected across the output terminals 42 and 44 of the full-wave rectifier 40 for protecting the rectifier circuit from excessive voltages that may be produced by the current transformer T1.

The voltage that is rectified by the full-wave rectifier 40 is applied across a resistor 54 which is connected between the output terminals 42 and 44. The voltage drop across this resistor 54 is applied through the resistor 46 to trigger the silicon rectifier 28.

Each of the monitoring circuits 20, 22, 24 and 26 includes all of the structure shown in FIG. 2 and, in particular, the full-wave rectifier 40, the zener diode 52, and the voltage divider network which includes resistors 46 and 48. This portion of the circuit is enclosed within the boxes identified by the reference character 56.

While a preferred embodiment of the invention has been described using specific terms, such description is for illustrative purposes only, and it is to be understood that changes and variations may be made without departing from the spirit or scope of the following claims.

What is claimed is:

1. An apparatus for monitoring faults such as grounding in an electrical power cable which produce an abnormally high current in that portion of said cable extending between a power supply connected to one end of said cable and the point where said cable is grounded, said apparatus comprising:
   (a) a power supply,
   (b) a resistive element connected to said power supply,
   (c) a plurality of current transformers spaced at predetermined points along said cable and coupled thereto for sensing current flowing through said cable,
   (d) trigger circuit means connected to each of said current transformers for increasing the voltage drop across said resistive element a predetermined amount responsive to an abnormally high current flowing through the current transformer that it is connected to,
   (e) said trigger circuit means including,
      (i) a resistor, and
      (ii) means for placing said resistor in series with said resistive element responsive to an abnormally high current flowing through the respective transformer to which the respective trigger circuit is connected, and
   (f) means for measuring the voltage drop across said resistive element for determining the number of current transformers said abnormally high current flows through,
   whereby the location of said grounded point of said cable can be determined from the magnitude of said voltage drop across said resistive element.

2. The apparatus as set forth in claim 1 wherein said means for placing said resistor in series with said resistive element includes a silicon controlled rectifier,
   a circuit including said silicon controlled rectifier, said resistor and said resistive element,
   means for connecting said silicon controlled rectifier to the respective transformer, and
   means for triggering said silicon controlled rectifier responsive to an abnormally high current flowing through the respective transformer for connecting said resistor in series with said resistive element.

3. The apparatus as set forth in claim 2 further comprising:
   a full wave rectifier interposed between each of said silicon controlled rectifiers and each of said current transformers.

4. An apparatus for monitoring faults such as short circuits in an electrical power cable which produce an abnormally high current in the portion of the cable extending between a power supply connected to one end of the cable and the point where said cable is grounded, said apparatus comprising:
   (a) a power supply,
   (b) a resistive element connected to said power supply,
   (c) a plurality of current transformers spaced at predetermined points along said cable and coupled thereto for sensing current flowing through said cable,
   (d) a plurality of resistors corresponding in number to said current transformers,
   (e) trigger circuit means connected to each of said current transformers for selectively connecting one of said resistors in series with said resistive element responsive to an abnormally high current flowing through the respective current transformer connected thereto, and (f) voltage sensing means for measuring the voltage drop across said resistive element so as to determine the number of transformers through which said abnormally high current travels, whereby the location of said grounded point of said cable can be determined from the magnitude of the voltage drop across said resistive element.

* * * * *